United States Patent
Mandalapu et al.

(10) Patent No.: US 12,519,085 B2
(45) Date of Patent: Jan. 6, 2026

(54) DIRECT COOLING FOR SoIC ARCHITECTURES

(71) Applicant: Advanced Micro Devices, Inc., Santa Clara, CA (US)

(72) Inventors: Chandra Sekhar Mandalapu, Fort Collins, CO (US); Rahul Agarwal, Santa Clara, CA (US); Hemanth Kumar Dhavaleswarapu, Austin, TX (US); Raja Swaminathan, Austin, TX (US)

(73) Assignee: Advanced Micro Devices, Inc., Santa Clara, CA (US)

(*) Notice: Subject to any disclaimer, the term of this patent is extended or adjusted under 35 U.S.C. 154(b) by 487 days.

(21) Appl. No.: 18/078,875

(22) Filed: Dec. 9, 2022

(65) Prior Publication Data

US 2025/0266394 A1 Aug. 21, 2025

(51) Int. Cl.
*H01L 25/065* (2023.01)
*H01L 23/473* (2006.01)
*H01L 25/00* (2006.01)

(52) U.S. Cl.
CPC ........ *H01L 25/0652* (2013.01); *H01L 23/473* (2013.01); *H01L 25/50* (2013.01); *H01L 2225/06582* (2013.01); *H01L 2225/06589* (2013.01)

(58) Field of Classification Search
CPC .............................. H01L 25/052; H01L 23/473
See application file for complete search history.

(56) References Cited

U.S. PATENT DOCUMENTS

| | | | |
|---|---|---|---|
| 6,717,812 B1 | 4/2004 | Pinjala et al. | |
| 7,608,924 B2 | 10/2009 | Myers et al. | |
| 7,795,726 B2* | 9/2010 | Myers | H01L 23/473 |
| | | | 257/713 |
| 10,128,213 B2 | 11/2018 | Yu et al. | |
| 2007/0284718 A1* | 12/2007 | Ha | H01L 25/03 |
| | | | 257/E25.023 |
| 2023/0326888 A1* | 10/2023 | Chang | H01L 25/50 |
| | | | 257/676 |
| 2024/0063066 A1* | 2/2024 | Karhade | H01L 23/481 |
| 2024/0113087 A1* | 4/2024 | Marin | H01L 25/50 |
| 2024/0145432 A1* | 5/2024 | Pang | H01L 23/552 |
| 2024/0186275 A1* | 6/2024 | Chiu | H01L 25/0652 |
| 2024/0203968 A1* | 6/2024 | Gandhi | H01L 24/16 |
| 2024/0321759 A1* | 9/2024 | Wang | H01L 23/49833 |
| 2025/0061319 A1* | 2/2025 | Nellis | G06F 1/3275 |
| 2025/0125309 A1* | 4/2025 | Yang | H01L 24/81 |
| 2025/0125314 A1* | 4/2025 | Deen | H01L 24/48 |
| 2025/0140642 A1* | 5/2025 | Lin | H01L 23/38 |
| 2025/0140754 A1* | 5/2025 | Chang | H01L 25/0657 |
| 2025/0140756 A1* | 5/2025 | Zhou | H01L 25/0657 |
| 2025/0140765 A1* | 5/2025 | Fu | H01L 24/24 |

* cited by examiner

*Primary Examiner* — Thao P Le
(74) *Attorney, Agent, or Firm* — Greenberg Traurig, LLP

(57) ABSTRACT

The disclosed device includes a bottom die layer comprising a bottom die and a top die layer positioned on the bottom die layer and comprising a plurality of top dies and at least one gap between two of the plurality of top dies. The device also includes a cover encapsulating the bottom die layer and the top die layer and comprising an inlet and an outlet for a fluid channel, wherein the fluid channel includes the at least one gap. Various other methods, systems, and computer-readable media are also disclosed.

20 Claims, 8 Drawing Sheets

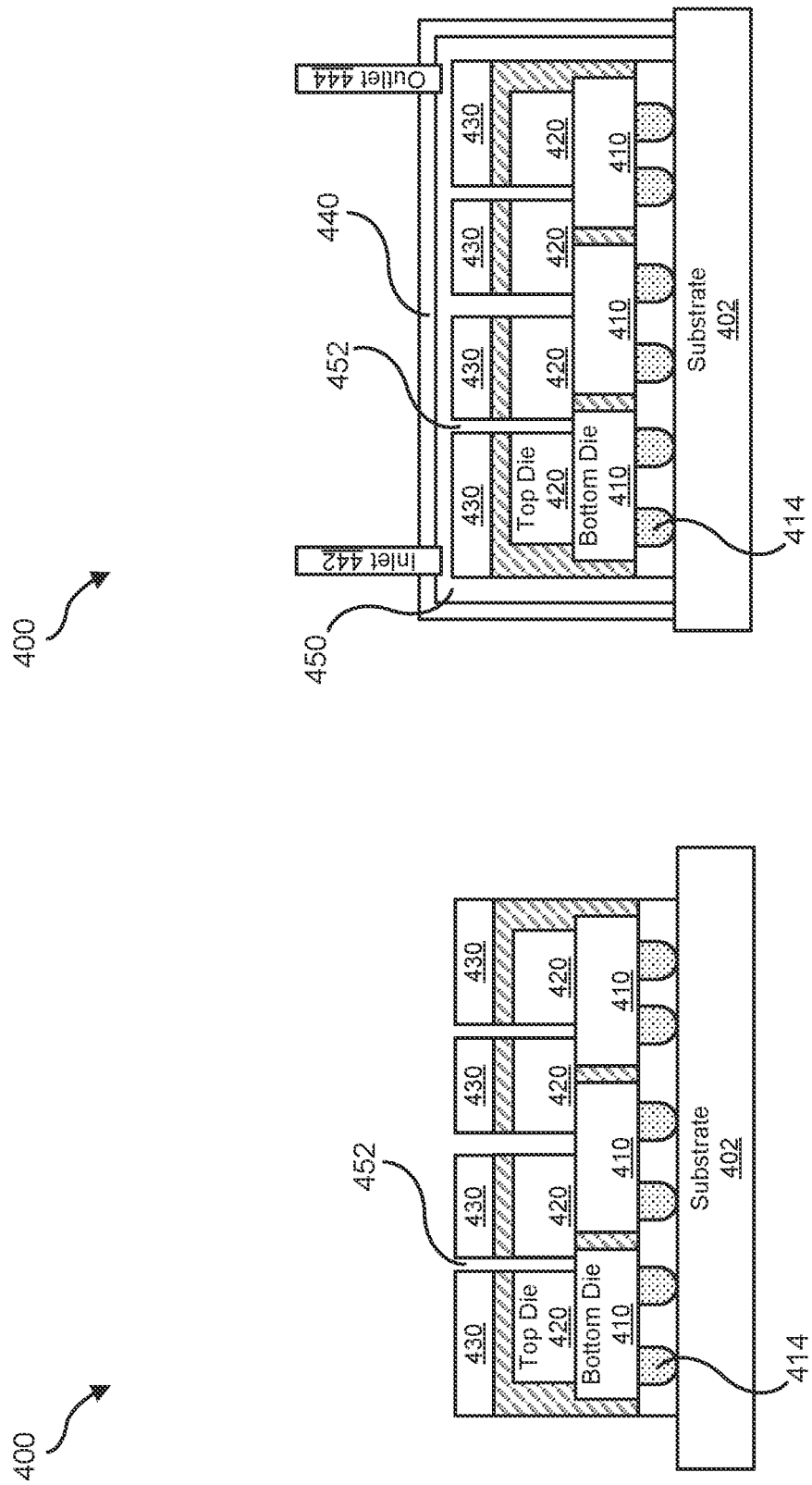

DIRECT COOLING FOR SoIC ARCHITECTURES

BACKGROUND

System-on-integrated-chip (SoIC) and other three-dimensional (3D) chip architectures integrate active and passive chips into a system-on-chip (SoC) system to provide higher functionality packaging density, reduced communication latency, and reduced energy consumption to improve computing efficiency. 3D architectures allow, for example, logic-on-logic or memory-on-logic chiplet stacking to allow integration of different chip sizes, functionalities and/or wafer node technologies into a single platform. Similar to other SoC architectures, SoIC architectures require thermal management.

BRIEF DESCRIPTION OF THE DRAWINGS

The accompanying drawings illustrate a number of exemplary implementations and are a part of the specification. Together with the following description, these drawings demonstrate and explain various principles of the present disclosure.

FIG. 4A-H are diagrams of exemplary steps for fabricating an SoIC with direct cooling.

Figure 1A:
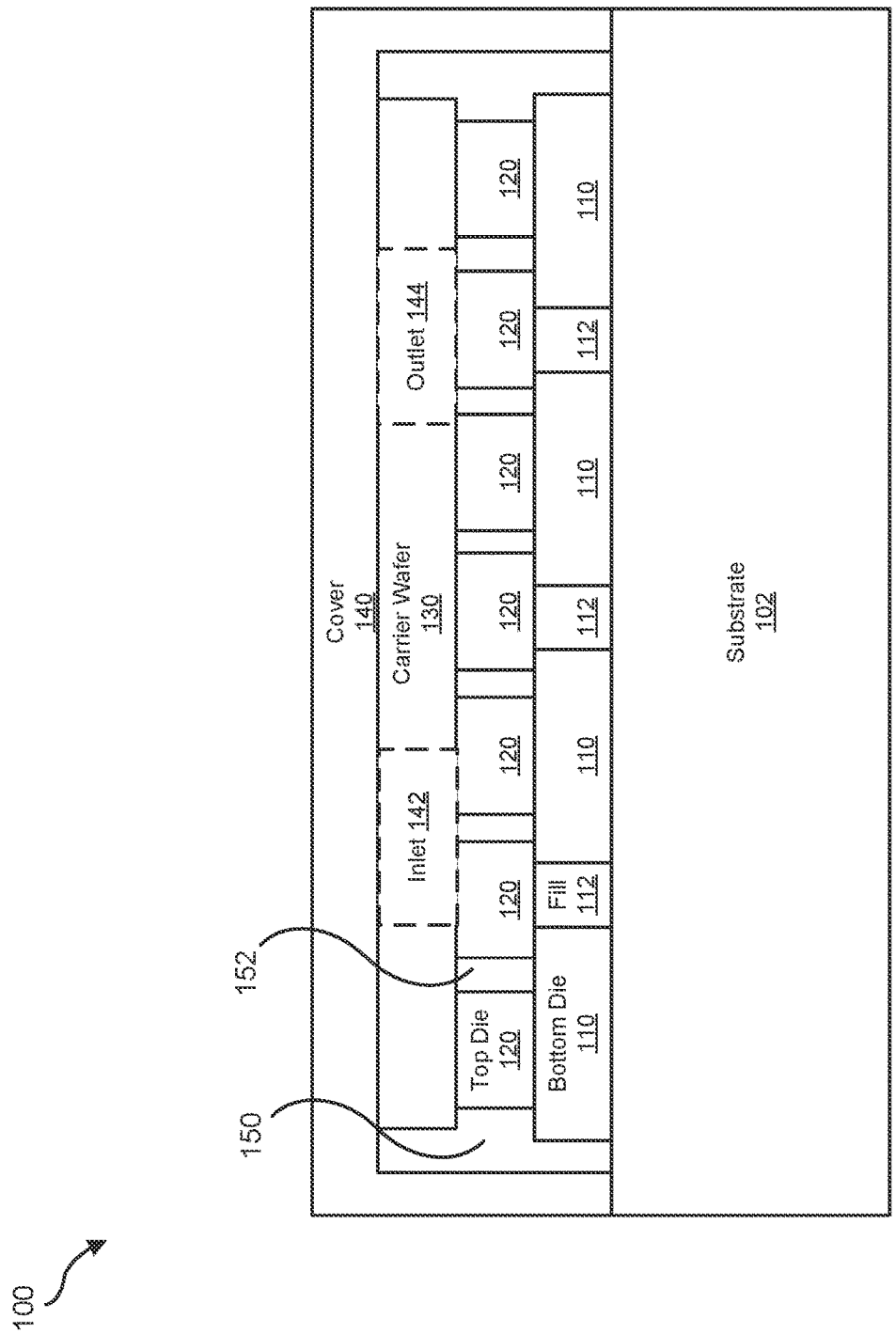
FIGS. 1A-B are diagrams of an exemplary direct cooling implementation on an SoIC architecture.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to an SoIC with direct cooling. As will be explained in greater detail below, implementations of the present disclosure provide for an SoIC having a bottom die layer, a top die layer positioned on the bottom die layer, and a cover encapsulating the bottom and top die layers. The cover includes an inlet and an outlet for a fluid channel that extends at least through gaps between dies of the top die layer. A pump can pump fluid through the fluid channel to provide direct cooling to the dies. Because the fluid can flow next to the dies, the implementations described herein can advantageously provide direct, localized cooling to the SoIC.

As will be described in greater detail below, in one example, a device includes a bottom die layer that includes a bottom die and a top die layer positioned on the bottom die layer that includes a plurality of top dies and at least one gap between two of the plurality of top dies. The device also includes a cover encapsulating the bottom die layer and the top die layer and includes an inlet and an outlet for a fluid channel. The fluid channel includes the at least one gap.

In some examples, the bottom die layer includes a second bottom die. In some examples, at least one of the plurality of top dies includes a first sidewall overlying a top face of the bottom die and a second sidewall opposite the first sidewall overlying a top face of the second bottom die. In some examples, the bottom die layer includes a gap between the bottom die and the second bottom die.

In some examples, dies of the top die layer are directly bonded to dies of the bottom die layer. In some examples, the top die layer includes a greater number of dies than the bottom die layer. In some examples, the bottom die is larger than at least one of the plurality of top dies. In some examples, at least one of the plurality of top dies includes a first sidewall overlying a top face of the bottom die and a second sidewall opposite the first sidewall overlying the top face of the bottom die.

In some examples, the device includes a pump for pumping a cooling fluid through the fluid channel. In some examples, at least one of the inlet or the outlet is located at a top surface of the cover. In some examples, at least one of the inlet or the outlet is located at a sidewall of the cover.

In one example, a system includes a substrate, a first die tier positioned on the substrate and includes a bottom die, a second die tier positioned on the first die tier and including a plurality of top dies and at least one gap between two of the plurality of top dies, and a cover attached to the substrate and encapsulating the first die tier and the second die tier and comprising an inlet and an outlet for a fluid channel. The fluid channel includes the at least one gap. The system also includes a pump for pumping a cooling fluid through the fluid channel.

In some examples, the first die tier includes a second bottom die and a gap between the bottom die and the second bottom die. In some examples, at least one of the plurality of top dies includes a first sidewall overlying a top face of the bottom die and a second sidewall opposite the first sidewall overlying a top face of the second bottom die. In some examples, dies of the second die tier are directly bonded to dies of the first die tier.

In some examples, at least one of the inlet or the outlet is located at a top surface or a sidewall of the cover. In some examples, the second die tier includes a greater number of dies than the first die tier and the bottom die is larger than at least one of the plurality of top dies. In some examples, at least one of the plurality of top dies includes a first sidewall overlying a top face of the bottom die and a second sidewall opposite the first sidewall overlying the top face of the bottom die.

In one example, a method includes bonding, to a first die tier, a second die tier, and etching away gap fill regions between dies of the second die tier to form a plurality of gaps. The method also includes attaching the first die tier to a substrate and attaching, to the substrate, a cover encapsulating the first die tier and the second die tier, the cover including an inlet and an outlet for a fluid channel, wherein the fluid channel includes the plurality of gaps.

In some examples, the method includes etching away gap fill regions between dies of the first die tier.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1A-4H, detailed descriptions of SoIC architectures with direct cooling. Detailed descriptions of example SoIC architectures with direct cooling will be provided in connection with FIGS. 1A-2. Detailed descriptions of corresponding fabrication methods will also be provided in connection with FIGS. 3-4H.

Figure 1B:
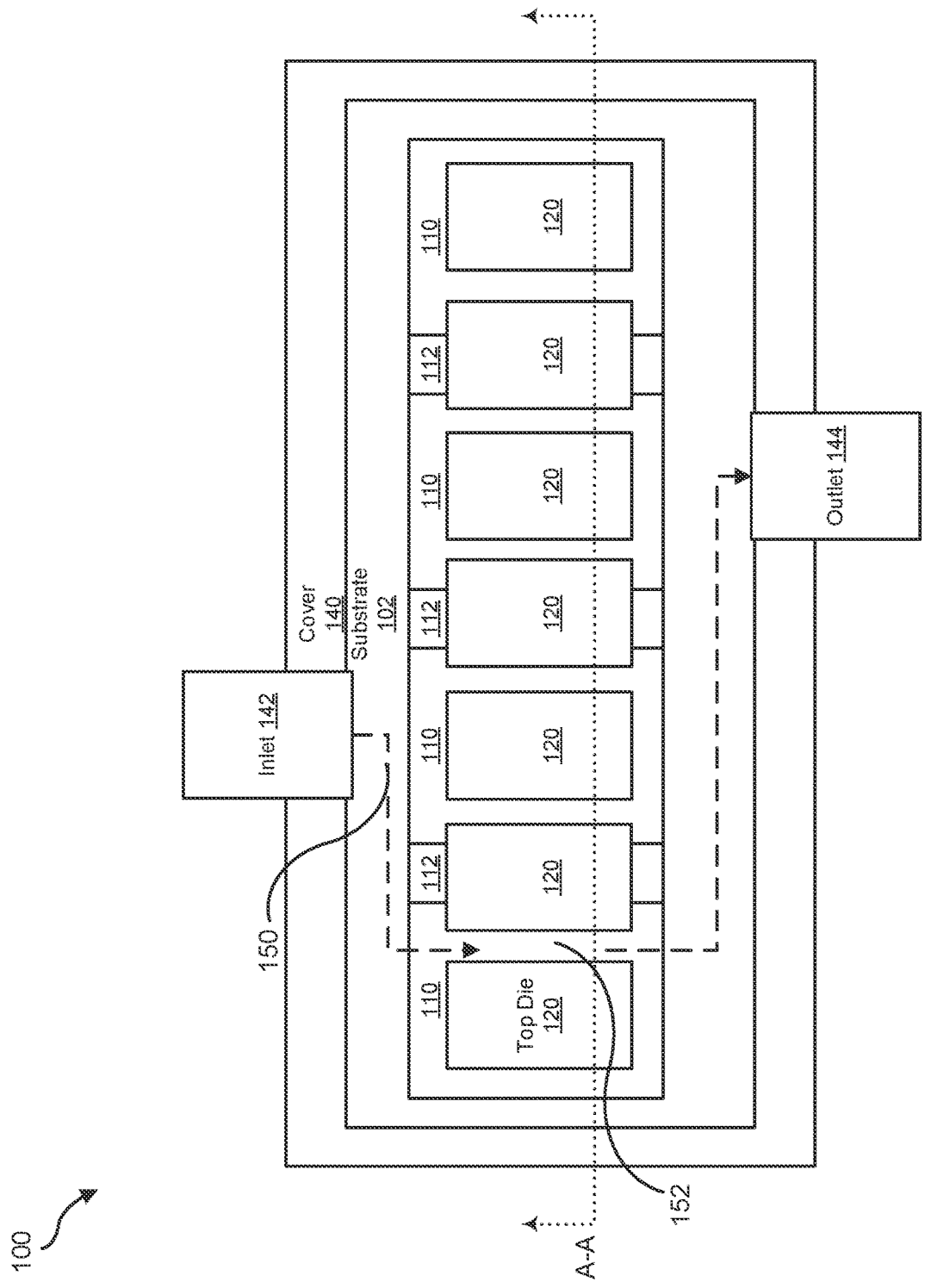

FIG. 1A illustrates a cut away side view of a device 100 having an example SoIC architecture (or other 3D architecture) with direct cooling (e.g., a view along the A-A axis depicted in FIG. 1B) and FIG. 1B illustrates a top-down layout view of device 100. Device 100 includes a substrate 102, a bottom die layer including bottom dies 110, a top die layer including top dies 120, a carrier wafer 130, and a cover 140 having an inlet 142 and an outlet 144. A fluid channel 150 is defined by at least empty spaces between cover 140 and the various structures housed within. Carrier wafer 130, which in some examples is made of silicon, glass, or other material, can provide structural support particularly during fabrication of device 100, although in some examples may be removed or reduced.

The bottom die layer includes multiple bottom dies 110 that correspond to various chiplets, such as processors, microprocessors, logic units, and/or any other component. The bottom die layer is positioned on substrate 102, which may correspond to a circuit board or any other surface for mounting chiplets. As further illustrated in FIGS. 1A-1B, a fill 112, such as an oxide or an adhesive, between bottom dies 110 can provide structural support, isolation, etc. Although FIGS. 1A-1B illustrate multiple bottom dies 110, in some examples the bottom die layer includes a single bottom die 110. In other examples, bottom dies 110 can take on various other shapes, sizes (e.g., relative to other bottom dies 110 and/or top dies 120), etc. For instance, bottom dies 110 are larger than top dies 120 (e.g., with respect to area) in FIGS. 1A-1B but in other examples bottom dies 110 can be smaller and/or equal in size to top dies 120.

The top die layer includes multiple top dies 120 that correspond to various chiplets, such as memory devices, logic units, and/or any other component. Although FIGS. 1A-1B illustrate multiple top dies 120, in some examples, top dies 120 may take on various other shapes, sizes (e.g., relative to other top dies 120 and/or bottom dies 110). As shown in FIG. 1A, the top die layer (e.g., top dies 120) is stacked onto the bottom die layer such that top dies 120 can be directly mounted onto and/or directly bonded (and/or hybrid bonded) to bottom dies 110, although in some examples there can be one or more interleaving layers therebetween.

As further shown if FIG. 1A, the placement of one or more top dies 120 can vary with respect to bottom dies 110. For example, the second (from the left in FIG. 1A) top die 120 includes a first sidewall overlying a top face of the first (from the left) bottom die 110, and a second sidewall opposite the first sidewall overlying a top face of the second bottom die 110. In some examples, as in FIGS. 1A-1B, device 100 includes a greater number of dies in the top layer than in the bottom layer, although in other examples the number can be the same or the bottom layer can include more dies.

As illustrated in FIG. 1A-1B, a gap 152 between top dies 120 corresponds to the empty spaces between neighboring top dies 120. As illustrated in FIG. 1B, fluid channel 150 extends between inlet 142 and outlet 144. Fluid channel 150 includes gaps 152 to allow a cooling fluid to be pumped next to and/or around at least top dies 120. Although not illustrated in FIGS. 1A-1B, device 100 can include a pump for pumping the cooling fluid through fluid channel 150. FIGS. 1A-1B further illustrate inlet 142 and outlet 144 located at and extending through the sidewalls of cover 140. Inlet 142 and outlet 144 provide openings in cover 140 and can be any appropriate shape for allowing fluid to flow through fluid channel 150. Cover 140 corresponds to a rigid material for encapsulating and protecting the dies therein. Cover 140 is attached to substrate 102 such that fluid cannot leak out of cover 140 except through inlet 142 and outlet 144.

Figure 2:
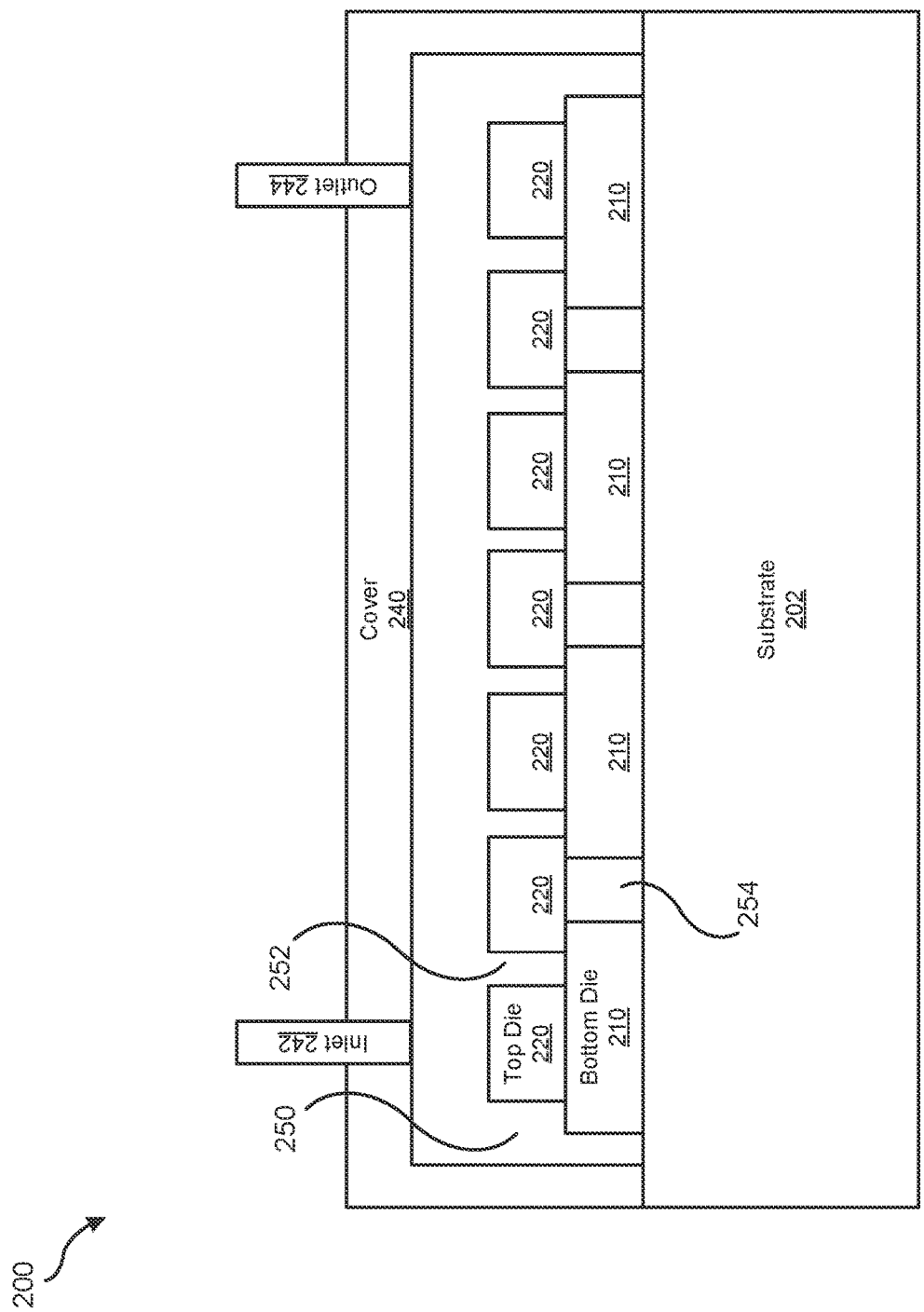
FIG. 2 is a diagram of another exemplary direct cooling implementation on an SoIC architecture.

FIG. 2 illustrates a device 200, corresponding to device 100, that shows another implementation of direct cooling in an SoIC. Device 200 includes a substrate 202 (corresponding to substrate 102), a bottom die layer of bottom dies 210 (corresponding to bottom dies 110), a top die layer of top dies 220 (corresponding to top dies 120), a cover 240 (corresponding to cover 140), an inlet 242 (corresponding to inlet 142), an outlet 244 (corresponding to outlet 144), a fluid channel 250 (corresponding to fluid channel 150), and gaps 252 (corresponding to gaps 152).

Device 200 includes several possible variations to an SoIC architecture having direct cooling. For example, device 200 does not include a top carrier wafer such that fluid channel 250 is open to allow the cooling fluid to flow across the top surfaces of top dies 220. Fluid channel 250 further includes gaps 254 between bottom dies 210 to allow the cooling fluid to flow between and/or around bottom dies 210. Moreover, inlet 242 and outlet 244 are located at and extend through the top surface of cover 240.

Figure 3:
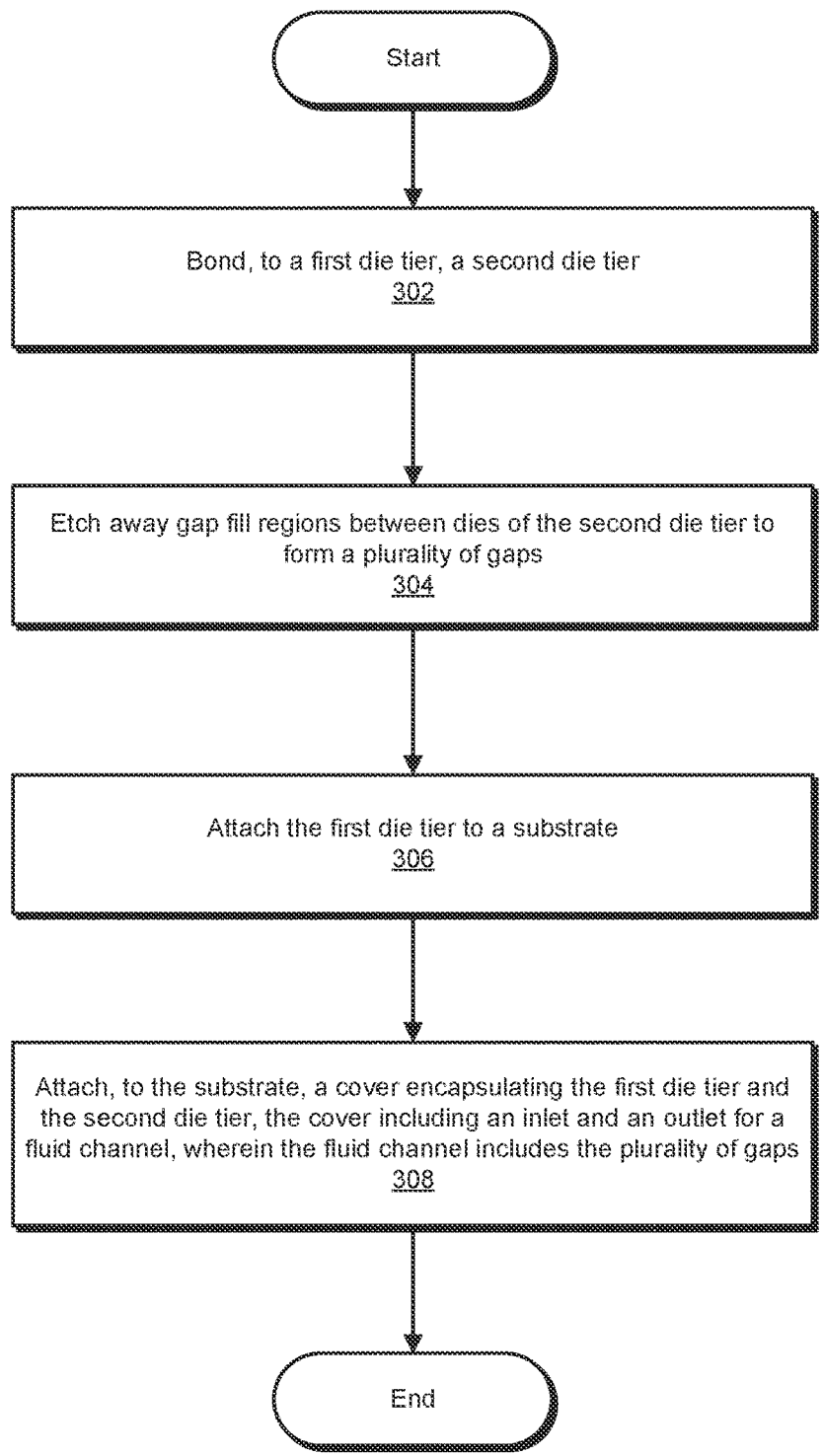
FIG. 3 is a flow diagram of an exemplary method for fabricating an SoIC with direct cooling.

FIG. 3 is a flow diagram of an exemplary method 300 for fabricating an SoIC having direct cooling. The steps shown in FIG. 3 can be performed using any suitable chip fabrication systems and/or techniques. At step 302 one or more of the systems described herein bonds, to a first die tier, a second die tier. FIGS. 4A-4H illustrate simplified fabrication stages for a device 400, corresponding to device 100, having a 3D architecture.

Figure 4B:
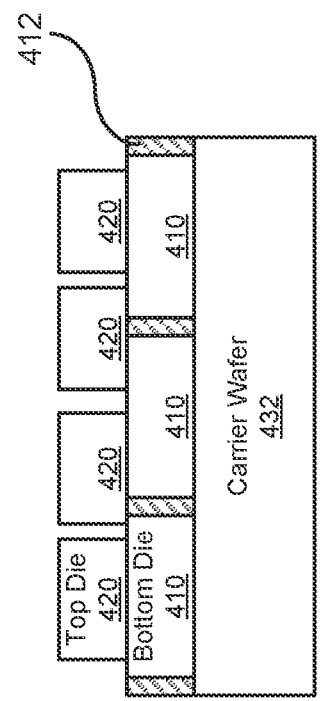
Figure 4A:
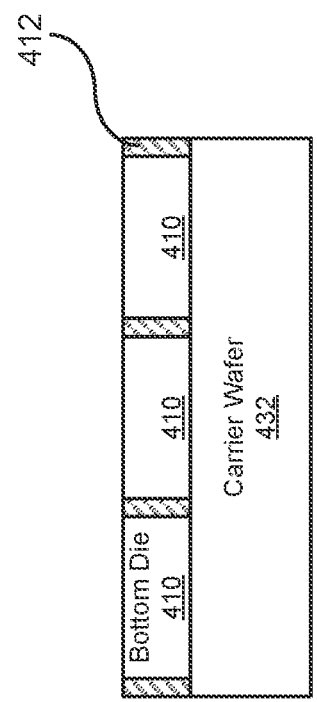

In FIG. 4A, the first die tier is formed on a carrier wafer 432. For example, a layer of fill 412 can be deposited onto carrier wafer 432, masked/etched for bottom dies 410, and filled to form bottom dies 410. Alternatively, the first die tier layer can be deposited and diced to form bottom dies 410, and fill 412 deposited between bottom dies 410. FIG. 4B illustrates the second die tier bonded to the first die tier. For example, a second fill layer can be deposited onto the first die tier, masked/etched for top dies 420, and filled to form top dies 420. In FIG. 4B, the fill layer is etched away.

Figure 4D:
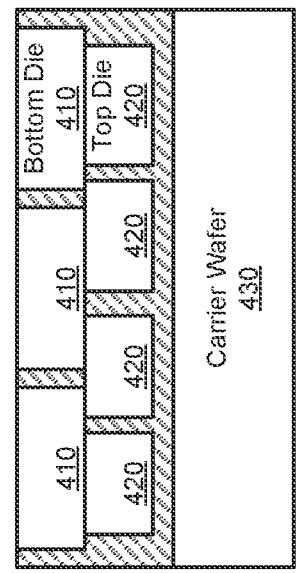
Figure 4C:
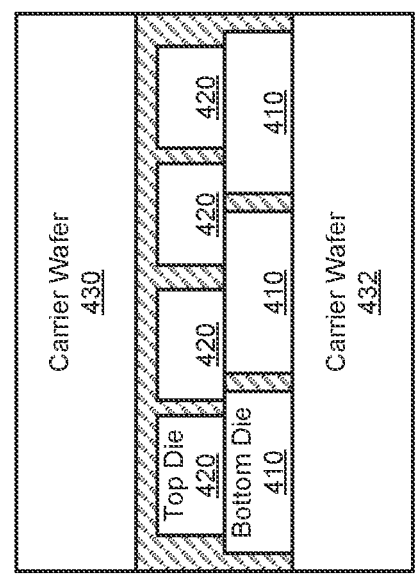

FIG. 4C illustrates bonding carrier wafer 430. A fill is first deposited over the first and second tier layers, and carrier wafer 430 is bonded to the fill. FIG. 4D illustrates removal of carrier wafer 432. Device 400 is flipped over and carrier wafer 432 is etched away to allow creation of connections to bottom dies 410.

Figure 4F:
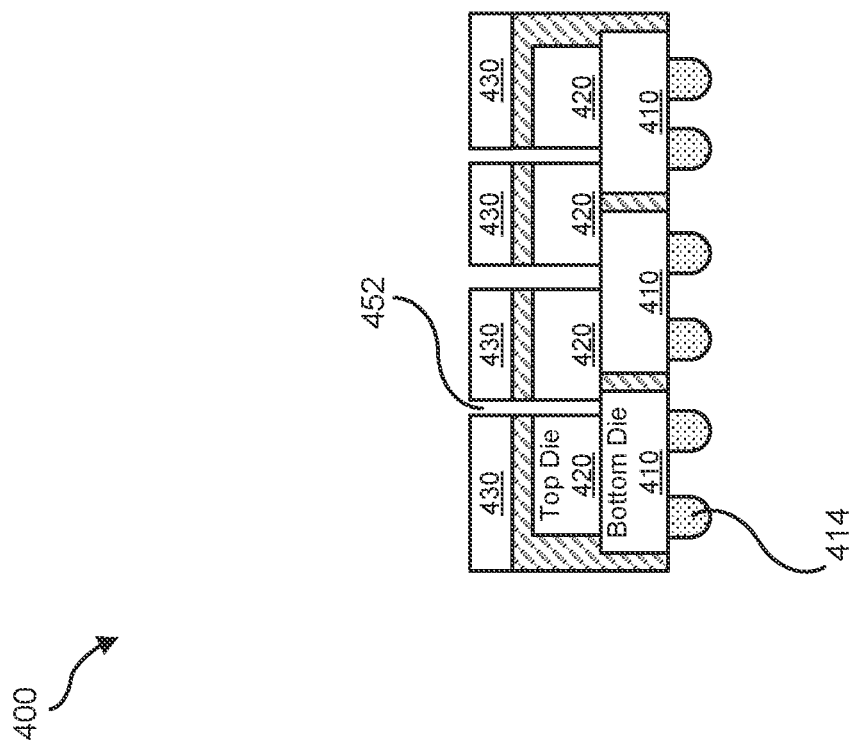
Figure 4E:
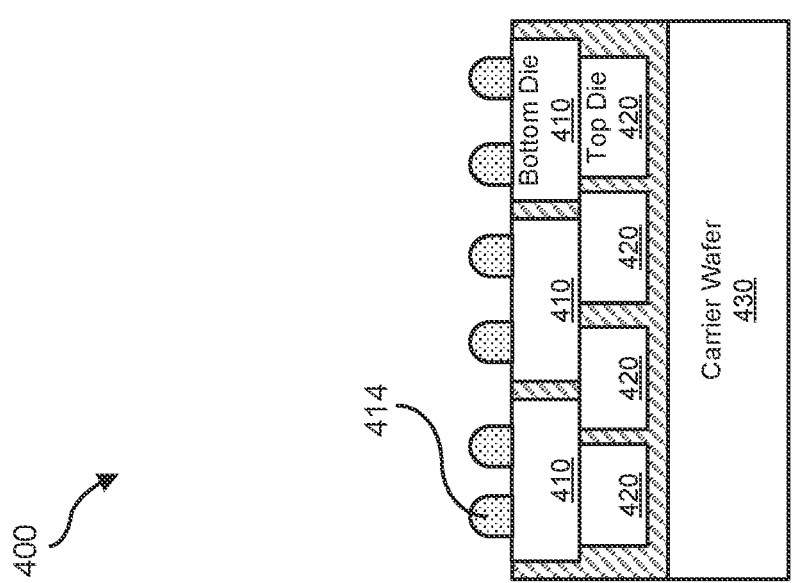

FIG. 4E illustrates passivation opening to form microbumps 414 for electrical connections to bottom dies 410. FIG. 4F shows device 400 flipped over (e.g., to its original orientation). Carrier wafer 430, which can be a silicon carrier wafer, is etched to thin down the layer. In other examples, carrier wafer 430 can be a sacrificial glass carrier wafer that is removed.

Returning to FIG. 3, at step 304 one or more of the systems described herein etches away gap fill regions between dies of the second die tier to form a plurality of gaps. For example, as shown in FIG. 4B, the gap fill regions are etched away such that there are gaps between top dies 420. A trench pattern opening creates gaps 452 between top dies 420 for dicing. In some examples, method 300 includes etching away gap fill regions between dies of the first die tier (e.g., as shown in FIG. 2).

At step 306 one or more of the systems described herein attaches the first die tier to a substrate. For example, FIG. 4G illustrates how bottom dies 410 and microbumps 414 are mounted onto a substrate 402 using an underfill.

At step 308 one or more of the systems described herein attaches, to the substrate, a cover encapsulating the first die tier and the second die tier. The cover includes an inlet and an outlet for a fluid channel, and the fluid channel includes the plurality of gaps. For example, FIG. 4H illustrates a cover 440 mounted onto substrate 402 to encapsulate the first and second die tiers. An inlet 442 and an outlet 444 is attached to cover 440. The space around the dies inside cover 440, including gaps 452, form a fluid channel 450 between inlet 442 and outlet 444.

Although not shown, a pump can be attached to inlet 442 and outlet 444 external to cover 440 to pump a cooling fluid through fluid channel 450. Because fluid channel 450 allows the cooling fluid to flow around and/or over at least portions of top dies 420 and/or bottom dies 410, the cooling fluid provides direct localized cooling to top dies 420 and/or bottom dies 410.

The systems and methods provided relate to 3D SoIC architectures, which may suffer from poor heat removal and high temperature gradients. Some cooling solutions are not able to remove the localized heat from 3D SoIC architectures, limiting the thermal design power (TDP) of the SoIC products. As described herein, by utilizing the gap fill regions as liquid cooling paths to dissipate the heat from hot spot regions, the implementations described herein provide direct localized cooling.

In one example process flow, a Tier1 chip on process flow is followed by tier2 bonding. The gap fill regions are either filled with oxide or adhesive depending on Si or glass carrier bonding. The process continues with a Carrier1 removal process flow. A passivation open is followed by bumping process. One option includes a glass carrier removal dicing process. A second option includes an Si carrier2 thin down and opening of the gap fill regions through a dry/wet etch dicing process.

The process continues with a substrate attach followed by underfill process. A lid attach is then followed by liquid inlet and outlet attach. The implementations described herein can advantageously improve TDP capacity, enables higher peak power density products, improve device performance by operating at lower temperatures, enable new stacking architectures which are currently hot spot limited (e.g., core-on-core stacking), utilize the gap fill regions as liquid cooling paths without much impact on silicon real estate, and/or enable lower Z-height profiles in assembled components and enable higher rack density.

The systems and methods described herein provide localized and direct liquid cooling of the package (e.g., within the SOIC module) without requiring an additional heat sink, which enables thinner Z-height products. Using the lid as liquid inlet and outlet further simplifies the design.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
    a bottom die layer comprising a bottom die;
    a top die layer positioned on the bottom die layer and comprising a plurality of top dies;
    a gap fill material in the top die layer;
    at least one gap between two of the plurality of top dies, wherein the at least one gap is empty of the gap fill material and extends between sidewalls of the two of the plurality of top dies; and
    a cover encapsulating the bottom die layer and the top die layer and comprising an inlet and an outlet for a fluid channel, wherein the fluid channel includes the at least one gap.

2. The device of claim 1, wherein the bottom die layer includes a second bottom die.

3. The device of claim 2, wherein at least one of the plurality of top dies includes a first sidewall overlying a top face of the bottom die and a second sidewall opposite the first sidewall overlying a top face of the second bottom die.

4. The device of claim 2, wherein the bottom die layer includes a gap between the bottom die and the second bottom die.

5. The device of claim 1, wherein dies of the top die layer are directly bonded to dies of the bottom die layer.

6. The device of claim 1, wherein the top die layer includes a greater number of dies than the bottom die layer.

7. The device of claim 1, wherein the bottom die is larger than at least one of the plurality of top dies.

8. The device of claim 1, wherein at least one of the plurality of top dies includes a first sidewall overlying a top face of the bottom die and a second sidewall opposite the first sidewall overlying the top face of the bottom die.

9. The device of claim 1, further comprising a pump for pumping a cooling fluid through the fluid channel.

10. The device of claim 1, wherein at least one of the inlet or the outlet is located at a top surface of the cover.

11. The device of claim 1, wherein at least one of the inlet or the outlet is located at a sidewall of the cover.

12. A system comprising:
- a substrate;
- a first die tier positioned on the substrate and comprising a bottom die;
- a second die tier positioned on the first die tier and comprising a plurality of top dies and at least one gap between two of the plurality of top dies;
- a cover attached to the substrate and encapsulating the first die tier and the second die tier and comprising an inlet and an outlet for a fluid channel, wherein the fluid channel includes the at least one gap; and
- a pump for pumping a cooling fluid through the fluid channel.

13. The system of claim 12, wherein the first die tier includes a second bottom die and a gap between the bottom die and the second bottom die.

14. The system of claim 13, wherein at least one of the plurality of top dies includes a first sidewall overlying a top face of the bottom die and a second sidewall opposite the first sidewall overlying a top face of the second bottom die.

15. The system of claim 12, wherein dies of the second die tier are directly bonded to dies of the first die tier.

16. The system of claim 12, wherein at least one of the inlet or the outlet is located at a top surface or a sidewall of the cover.

17. The system of claim 12, wherein the second die tier includes a greater number of dies than the first die tier and the bottom die is larger than at least one of the plurality of top dies.

18. The system of claim 12, wherein at least one of the plurality of top dies includes a first sidewall overlying a top face of the bottom die and a second sidewall opposite the first sidewall overlying the top face of the bottom die.

19. A method comprising:
- bonding, to a first die tier, a second die tier;
- etching away gap fill regions between dies of the second die tier to form a plurality of gaps;
- attaching the first die tier to a substrate; and
- attaching, to the substrate, a cover encapsulating the first die tier and the second die tier, the cover including an inlet and an outlet for a fluid channel, wherein the fluid channel includes the plurality of gaps.

20. The method of claim 19, further comprising etching away gap fill regions between dies of the first die tier.

* * * * *